United States Patent
Plumadore (10) Patent No.: US 9,906,239 B1
(45) Date of Patent: Feb. 27, 2018

(54) GPU PARALLEL HUFFMAN DECODING

(71) Applicant: ATI Technologies ULC, Markham (CA)

(72) Inventor: Kyle Plumadore, Toronto (CA)

(73) Assignee: ATI Technologies ULC, Markham (CA)

( * ) Notice: Subject to any disclaimer, the term of this patent is extended or adjusted under 35 U.S.C. 154(b) by 0 days.

(21) Appl. No.: 15/636,306

(22) Filed: Jun. 28, 2017

(51) Int. Cl.
*H03M 7/40* (2006.01)
*G06T 1/20* (2006.01)

(52) U.S. Cl.
CPC .......... *H03M 7/40* (2013.01); *G06T 1/20* (2013.01); *G06T 2200/28* (2013.01)

(58) Field of Classification Search
CPC ........ H03M 7/40; H03M 7/4031; H03M 7/00; H03M 5/00; G06T 1/20; G06T 220/28
USPC .............................................. 341/67, 50, 51
See application file for complete search history.

(56) References Cited

U.S. PATENT DOCUMENTS

2010/0020970 A1* 1/2010 Liu ...................... G06K 7/1093
380/255

OTHER PUBLICATIONS

Klein et al., "Parallel Huffman Decoding with Applications to JPEG Files", The Computer Journal, 2003, pp. 487-497, vol. 46, No. 5.

* cited by examiner

*Primary Examiner* — Jean B Jeanglaude
(74) *Attorney, Agent, or Firm* — Rory D. Rankin; Meyertons, Hood, Kivlin, Kowert & Goetzel, P.C.

(57) ABSTRACT

Systems, apparatuses, and methods for implementing a parallel Huffman decoding scheme are disclosed herein. A system with a plurality of execution units receives a Huffman encoded bitstream. The system partitions the encoded bitstream into a plurality of chunks. Each execution unit is assigned to decode a separate chunk of the encoded bitstream as well as an extra portion of an adjacent chunk. With this approach, the decoding of the bitstream overlaps for a programmable amount of data at each chunk boundary since each execution unit, excluding the first execution unit decoding the first chunk of the bitstream, will likely decode a certain number of symbols incorrectly at the beginning of the chunk since the chunk boundaries will not be aligned with symbol boundaries. The system determines, from the decoded extra portion at each chunk boundary, where incorrectly decoded ends and where correctly decoded data begins for each decoded chunk.

20 Claims, 9 Drawing Sheets

FIG. 9

GPU PARALLEL HUFFMAN DECODING

BACKGROUND

Description of the Related Art

Variable length coding schemes are commonly used in many different computing and communication applications. In coding theory, a variable-length code is a code which maps source symbols to a variable number of bits. Variable-length codes typically allow for lossless data compression. Examples of variable-length coding schemes include Huffman coding, Lempel-Ziv coding, and arithmetic coding. Huffman coding is utilized in several video and image compression standards. Variable length coding schemes utilize a probabilistic approach, where more common symbols map to fewer encoded bits than less common symbols.

For Huffman encoded bitstreams, there is an unpredictable relationship between encoded and decoded bits of data. This is caused by more frequent symbols being encoded with fewer bits than less frequent symbols. Due to this trait, a naïve parallel algorithm cannot be used to decode Huffman data. For example, a valid start location for decoding Huffman data cannot be arbitrarily found in the encoded data without decoding all the data up to that point. Hence, this has prevented the implementation of parallel schemes for decoding Huffman encoded data.

BRIEF DESCRIPTION OF THE DRAWINGS

The advantages of the methods and mechanisms described herein may be better understood by referring to the following description in conjunction with the accompanying drawings, in which.

DETAILED DESCRIPTION OF EMBODIMENTS

In the following description, numerous specific details are set forth to provide a thorough understanding of the methods and mechanisms presented herein. However, one having ordinary skill in the art should recognize that the various embodiments may be practiced without these specific details. In some instances, well-known structures, components, signals, computer program instructions, and techniques have not been shown in detail to avoid obscuring the approaches described herein. It will be appreciated that for simplicity and clarity of illustration, elements shown in the figures have not necessarily been drawn to scale. For example, the dimensions of some of the elements may be exaggerated relative to other elements.

Systems, apparatuses, and methods for implementing a parallel bitstream decoding scheme are disclosed herein. In one embodiment, a system includes at least a plurality of execution units and a memory. The system is configured to receive an encoded bitstream. In one embodiment, the received bitstream is encoded using a variable-length coding scheme. For example, in one embodiment, the received bitstream is encoding using a Huffman encoding scheme. In other embodiments, the received bitstream is encoded using other types of encoding schemes.

The system partitions the encoded bitstream into a plurality of chunks. Each execution unit is assigned to decode a separate chunk of the encoded bitstream as well as an extra portion of an adjacent chunk. With this approach, the decoding of the bitstream overlaps for a programmable amount of data at each chunk boundary since each execution unit, excluding the first execution unit decoding the first chunk of the bitstream, will likely decode a certain number of symbols incorrectly at the beginning of the chunk since the chunk boundaries are not aligned with the symbol boundaries. The system determines, from the decoded extra portion at each chunk boundary, where incorrectly decoded data ends and where correctly decoded data begins for each decoded chunk. Then, the system retains the correctly decoded data in the memory while discarding the incorrectly decoded data. As used herein, the term "symbol" is defined as a collection of one or more bits which are treated as a single unit.

In one embodiment, each execution unit of the plurality of execution units, excluding the last execution unit, is configured to decode both an assigned chunk of the encoded bitstream and the extra portion of the adjacent chunk. The last execution unit decoding the final chunk of the bitstream decodes only its assigned chunk. Each execution unit also records end of symbol bitstream locations for a first N symbols of the assigned chunk and for a first N symbols of the extra portion of data from the adjacent chunk, wherein N is a positive integer. Next, each execution unit determines where end of symbol bitstream locations of the extra portion of the adjacent chunk match end of symbol bitstream locations from data decoded by an adjacent execution unit for the adjacent chunk. Then, each execution unit copies, into a given location in the memory, decoded data up to where the end of symbol bitstream locations match.

Figure 1:
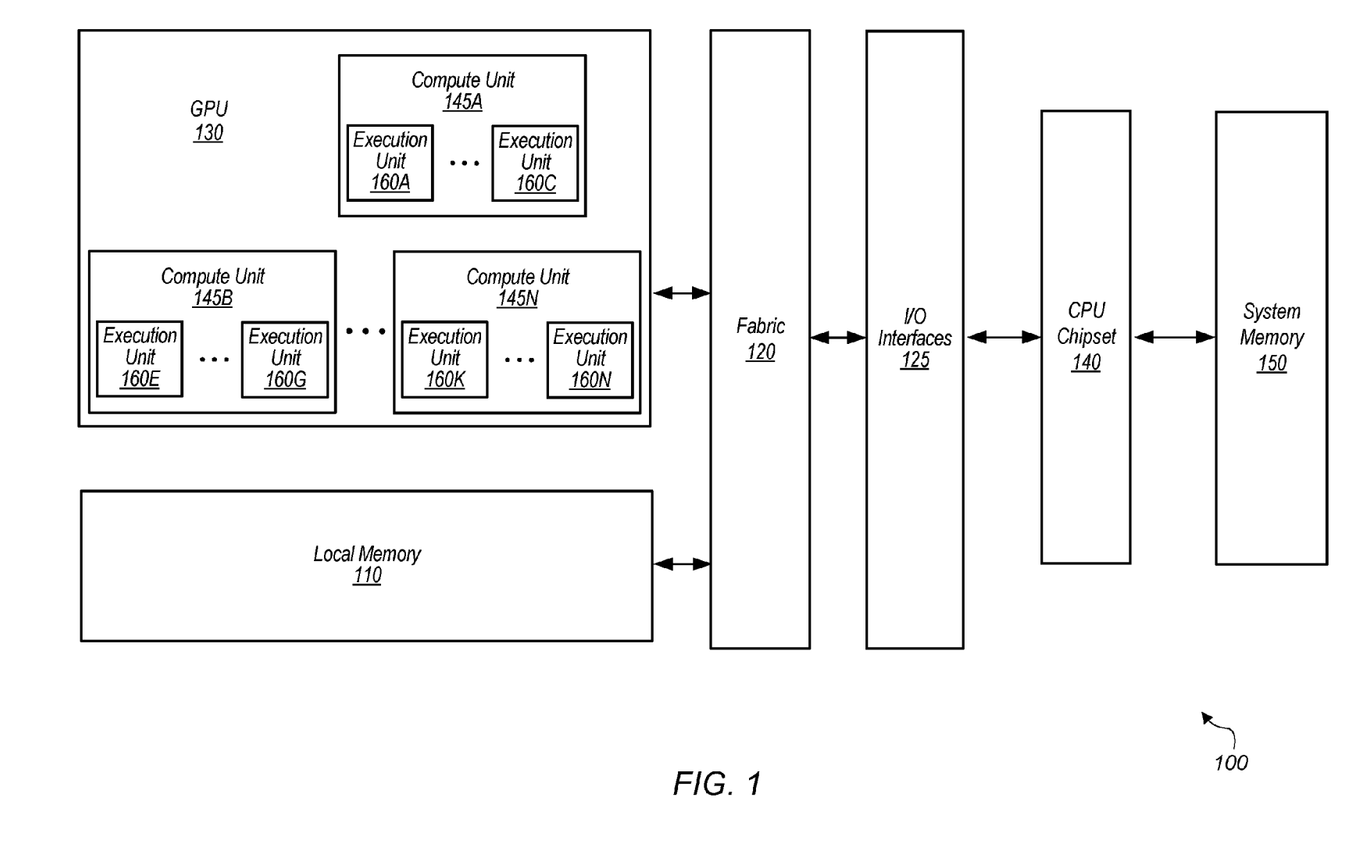
FIG. 1 is a block diagram of one embodiment of a computing system.

Referring now to FIG. 1, a block diagram of one embodiment of a computing system 100 is shown. In one embodiment, computing system 100 includes a system memory 150, input/output (I/O) interfaces 125, fabric 120, graphics processing unit (GPU) 130, local memory 110, and central processing unit (CPU) Chipset 140. System 100 can also include other components not shown in FIG. 1 to avoid obscuring the figure. In another embodiment, GPU 130 can be another type of processing unit (e.g., CPU, application specific integrated circuit (ASIC), field programmable gate array (FPGA), digital signal processor (DSP)).

GPU 130 includes at least compute units 145A-N which are representative of any number and type of compute units. Each compute unit 145A-N includes any number of execution units 160A-N, with the number of execution units varying from embodiment to embodiment. GPU 130 is coupled to local memory 110 via fabric 120. In one embodiment, local memory 110 is implemented using high-bandwidth memory (HBM). In one embodiment, GPU 130 is configured to execute graphics pipeline operations such as draw commands, pixel operations, geometric computations, and other operations for rendering an image to a display. In another embodiment, GPU 130 is configured to execute operations unrelated to graphics. In a further embodiment, GPU 130 is configured to execute both graphics operations and non-graphics related operations.

In one embodiment, GPU 130 is configured to implement a parallel decoding scheme of a bitstream encoded using a variable-length code. GPU 130 partitions the bitstream into a plurality of chunks and then assigns each chunk to a different execution unit of execution units 160A-N. Each execution unit decodes its assigned chunk and continues decoding for a portion of the adjacent chunk. Since chunk boundaries will not necessarily align with symbol boundaries in the encoded bitstream, each execution unit (excluding the first execution unit) will likely decode some number of symbols incorrectly at the start of the chunk. Accordingly, the extra portion of the chunk decoded by a previous execution unit is utilized to correct for any errors at the beginning of the chunk. For each decoded chunk (excluding the first chunk), the corrected data at the beginning of the chunk is combined with the rest of the correctly decoded symbols from the remainder of the chunk. This correctly decoded data is then stored in local memory 110, system memory 150, or another location (e.g., cache, local data share) in system 100.

I/O interfaces 125 are coupled to fabric 120, and I/O interfaces 125 are representative of any number and type of interfaces (e.g., peripheral component interconnect (PCI) bus, PCI-Extended (PCI-X), PCIE (PCI Express) bus, gigabit Ethernet (GBE) bus, universal serial bus (USB)). GPU 130 is coupled to system memory 150, which includes one or more memory modules. Each of the memory modules includes one or more memory devices mounted thereon. In some embodiments, system memory 150 includes one or more memory devices mounted on a motherboard or other carrier upon which GPU 130 and/or other components are also mounted. In one embodiment, system memory 150 is used to implement a random access memory (RAM) for use with GPU 130 during operation. The RAM implemented can be static RAM (SRAM), dynamic RAM (DRAM), Resistive RAM (ReRAM), Phase Change RAM (PCRAM), or any other volatile or non-volatile RAM. The type of DRAM that is used to implement system memory 150 includes (but is not limited to) double data rate (DDR) DRAM, DDR2 DRAM, DDR3 DRAM, and so forth.

In various embodiments, computing system 100 can be a computer, laptop, mobile device, server or any of various other types of computing systems or devices. It is noted that the number of components of computing system 100 and/or GPU 130 can vary from embodiment to embodiment. There can be more or fewer of each component/subcomponent than the number shown in FIG. 1. It is also noted that computing system 100 and/or GPU 130 can include other components not shown in FIG. 1. For example, in another embodiment, GPU 130 can represent a multicore processor. Additionally, in other embodiments, computing system 100 and GPU 130 can be structured in other ways than shown in FIG. 1.

Figure 2:
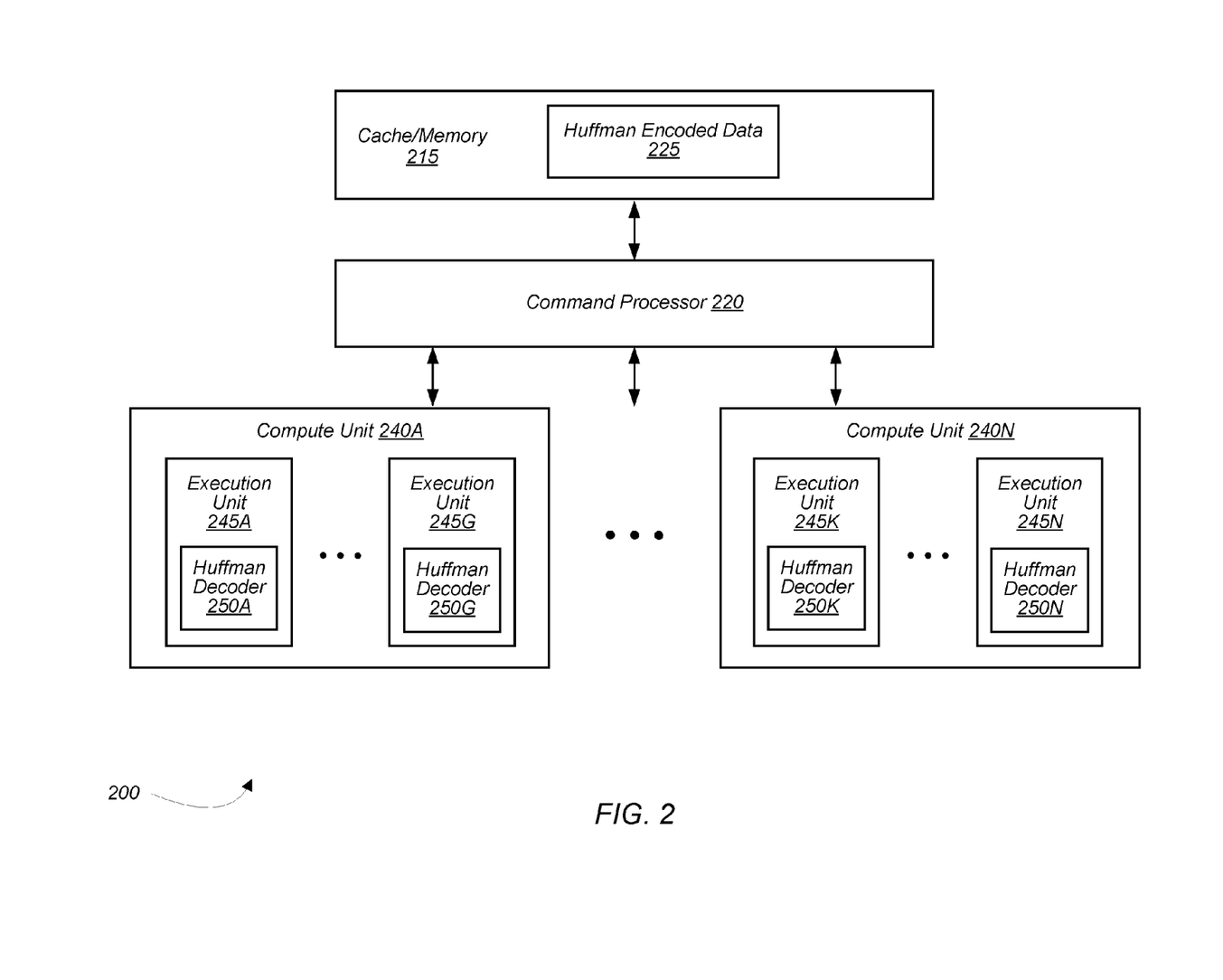
FIG. 2 is a block diagram of one embodiment of a GPU for decoding a Huffman encoded stream in parallel.

Turning now to FIG. 2, a block diagram of one embodiment of a GPU 200 for decoding a Huffman encoded bitstream in parallel is shown. In one embodiment, GPU 200 includes at least cache/memory 215, command processor 220, and compute units 240A-N. It is noted that GPU 200 can also include other components which are not shown to avoid obscuring the figure. Cache/memory 215 is representative of any number and type of caches and/or memories. As shown in FIG. 2, cache/memory 215 stores Huffman encoded data 225, which is representative of a Huffman encoded bitstream. In one embodiment, GPU 200 receives Huffman encoded data 225 from another source. In another embodiment, GPU 200 receives other data, which GPU 200 then processes to generate Huffman encoded data 225.

Command processor 220 is coupled to cache/memory 215 and compute units 240A-N. Compute units 240A-N are representative of any number and type of compute units. Each compute unit 240A-N includes a plurality of execution units, with the number of execution units varying from embodiment to embodiment. Although not shown in FIG. 2, each compute unit 240A-N can also include one or more caches and/or buffers for storing data. Each execution unit 245A-N is configured to execute instructions to implement a corresponding Huffman decoder 250A-N. Each Huffman decoder 250A-N can utilize any suitable Huffman decoding algorithm.

In one embodiment, command processor 220 is configured to invoke Huffman decoder kernels 250A-N to perform a Huffman decoding task in parallel on execution units 245A-N. In one embodiment, a predetermined amount of space is allocated in cache/memory 215 prior to invoking Huffman decoder kernels 250A-N. This allocated space is then utilized by Huffman decoder kernels 250A-N to store the individual portions of decoded data. Command processor 220 is configured to partition Huffman encoded data 225 into a plurality of chunks. Then, command processor 220 assigns a different chunk, plus an extra portion of the adjacent chunk, to each execution unit of execution units 245A-N. In one embodiment, command processor 220 conveys a portion of Huffman encoded data 225 to each execution unit 245A-N to be decoded in parallel. In another embodiment, command processor 220 conveys an indication of a starting location and an amount of data to each execution unit 245A-N, and then each execution unit 245A-N retrieves the corresponding data from Huffman encoded data 225 in cache/memory 215. Each execution unit 245A-N then decodes the data assigned to the execution unit 245A-N in parallel with the other execution units 245A-N. After each execution unit 245A-N finishes decoding its assigned plus extra portion of Huffman encoded data 225, the execution unit writes the decoded data to a specific region of cache/memory 215 previously allocated for the execution unit.

In one embodiment, prior to writing the decoded data to cache/memory 215, each execution unit 245A-N compares the decoded data in the extra portion of the adjacent chunk to the decoded data generated by another execution unit 245A-N for the adjacent chunk. Some number of symbols will likely be decoded incorrectly at the start of each chunk by each execution unit 245A-N, other than the first execution unit decoding the first chunk of Huffman encoded data 225. Each execution unit 245A-N can use the decoded data in the extra portion to correct for the incorrectly decoded symbols at the start of each chunk. The correctly decoded data is then written to given locations within cache/memory 215. It is noted that in one embodiment, this processing of the extra portion to correct for incorrectly decoded symbols is performed in parallel by the plurality of execution units 245A-N. Accordingly, after the plurality of execution units 245A-N decode, in parallel, their assigned chunk and the extra portion of the adjacent chunk, the plurality of execution units 245A-N simultaneously process the extra portion and the start of the adjacent chunk to correct for any incorrectly decoded symbols at the start of the adjacent chunk. For example, in one embodiment, the first execution unit 245A processes the start of the second chunk, the second execution unit 245B processes the start of the third chunk, and so on, all in parallel. Alternatively, in another embodiment, the second execution unit 245B processes the start of the second chunk using the extra data decoded by the first execution unit 245A, the third execution unit 245C processes the start of the third chunk using the extra data decoded by the second execution unit 245B, and so on.

Figure 3:
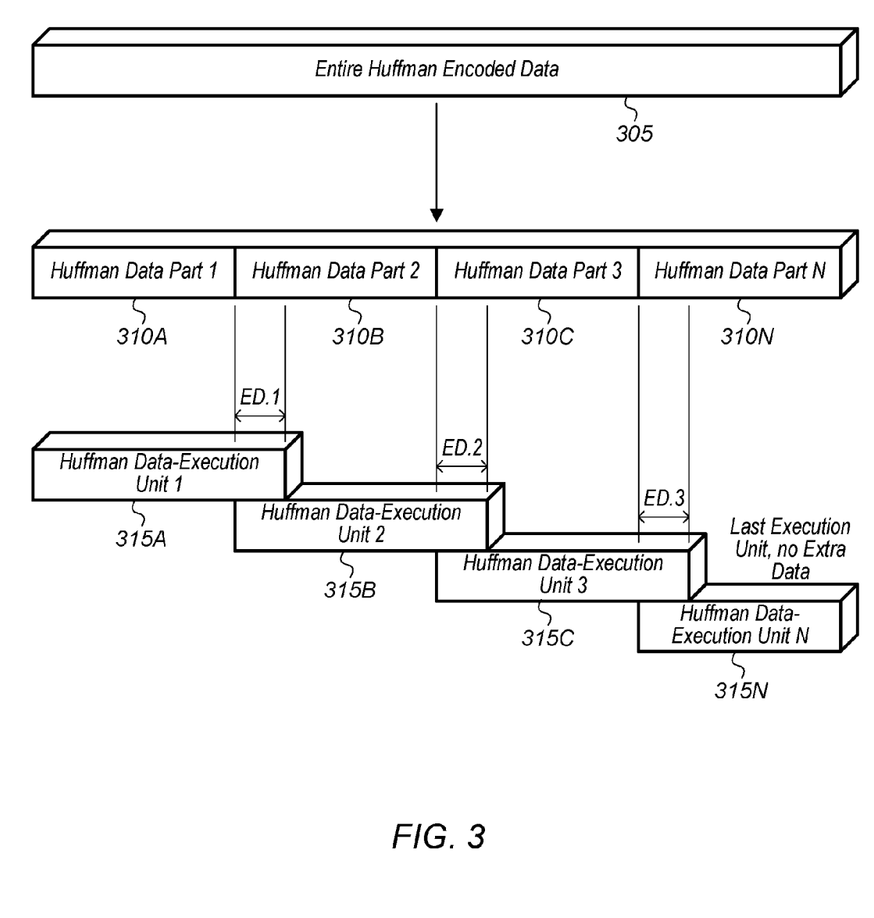
FIG. 3 is a block diagram of one embodiment of implementing a parallel Huffman decoding scheme.

Referring now to FIG. 3, a block diagram of one embodiment implementing parallel decoding of Huffman encoded data is shown. The rectangle 305 represents a quantity of Huffman encoded data. The block can include any amount of data, with the amount of data in rectangle 305 varying according to the embodiment. In one embodiment, the system decoding Huffman encoded data 305 receives or already has the information necessary for decoding Huffman encoded data 305. In one embodiment, the information includes a table mapping Huffman codes to original data symbols.

Huffman encoded data 305 can be partitioned into a plurality of smaller chunks 310A-N, and then the individual chunks 310A-N can be processed separately by different execution units. For example, in one embodiment, each chunk 310A-N can be assigned to a different execution unit 315A-N of a GPU. Additionally, after each execution unit 315A-N processes its assigned chunk of data, each execution unit 315A-N processes extra data (ED) from the adjacent chunk of data. However, the execution unit which processes the last chunk 310N of data does not fetch any extra data since this is the last chunk of data from the original Huffman encoded data 305.

In one embodiment, each execution unit decodes its assigned chunk 310 plus the extra data and stores the decoded data in an output buffer. In one embodiment, each execution unit also records the end of symbol offsets for the first N symbol of its own data and the end of symbol offsets for the first N symbol of the extra data. It is noted that the value of N can vary according to the embodiment, wherein N is a positive integer. The value of N can also be programmable in various embodiments.

In one embodiment, the amount of extra data which is processed by each execution unit can vary according to the embodiment. In one embodiment, how much extra data each execution unit processes can be calculated based on an analysis of the Huffman code used to encode data 305. For example, if the particular Huffman encoding approach has a high number of symbols which have common suffixes, this indicates that there is a high probability that symbols will become realigned quickly after a chunk boundary. In this case, the amount of extra data which is processed by each execution unit from the adjacent chunk can be relatively small, since the transition from decoding symbols incorrectly to decoding them correctly will likely occur soon after the chunk boundary. Otherwise, if the particular Huffman code used to encode data 305 has a low number of symbols which share suffixes, then the symbols will likely take longer to become correctly realigned after a chunk boundary, and so the amount of extra data which is processed by each execution unit in the adjacent chunk should be relatively large.

In one embodiment, a clean-up phase is executed after the parallel execution of chunks 310A-N by execution units 315A-N. For example, if the extra data processed by a given execution unit was not enough to correct for the amount of data which was incorrectly decoded by the adjacent execution unit, then another pass at decoding this chunk of data can be performed to correct any errors.

Figure 4:
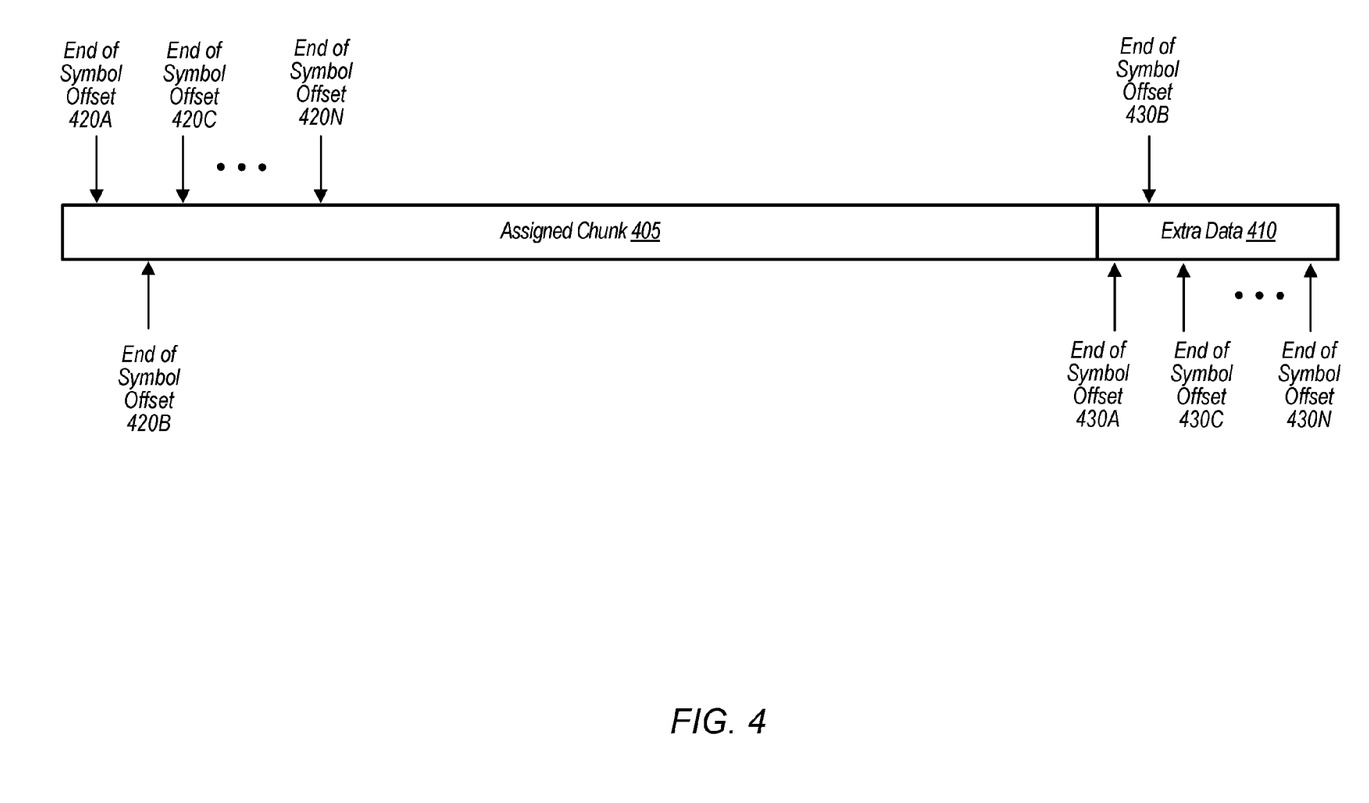
FIG. 4 is a diagram illustrating one embodiment of end of symbol offsets within decoded chunks.

Turning now to FIG. 4, a block diagram of one embodiment of end of symbol offsets within chunks 405 and 410 is shown. In one embodiment, each execution unit which processed a given chunk of data and extra data from the adjacent chunk is configured to record the first N end of symbol offsets in the decoded data within the given chunk and the first N end of symbol offsets in the extra data from the adjacent chunk. It is noted that the number N of symbol offsets which are recorded can vary from embodiment to embodiment.

These N end of symbol offsets are then utilized to determine where the correctly decoded data starts within the given chunk of data by comparing to the adjacent execution unit's record of the end of symbol offsets. Any incorrectly decoded data can then be discarded, and correctly decoded data can be aligned between the data decoded by execution units which are decoding adjacent chunks of data.

Assigned chunk 405 is one example of a chunk of Huffman encoded data which is assigned to and decoded by a given execution unit. Extra data 410 is an example of data which is retrieved from the adjacent chunk of data and decoded so as to produce enough correctly decoded data to make up for the adjacent execution unit not correctly decoding characters at the beginning of the adjacent chunk. End of symbol offset 420A is representative of the end of the first decoded symbol of assigned chunk of data 405, end of symbol offset 420B is representative of the end of the second decoded symbol of assigned chunk of data 405, end of symbol offset 420C is representative of the end of the third decoded symbol of assigned chunk of data 405, and so on. The last recorded end of symbol offset is shown as end of symbol offset 420N which represents the end of the Nth decoded symbol of assigned chunk of data 405.

Similarly, for the extra data 410, end of symbol offset 430A is representative of the end of the first decoded symbol of extra data 410, end of symbol offset 430B is representative of the end of the second decoded symbol of extra data 410, end of symbol offset 430C is representative of the end of the third decoded symbol of extra data 410, and so on. The last recorded end of symbol offset for extra data 410 is shown as end of symbol offset 420N.

In one embodiment, the end of symbol offsets 420A-N are stored as a number of bits from the beginning of the chunk of data 405. Similarly, the end of symbol offsets are stored as a number of bits from the end of chunk of data 405 (i.e., the start of the next chunk of data). In one embodiment, the end of symbol offsets 420A-N and 430A-N are stored in a table. In other embodiments, the end of symbol offsets 420A-N and 430A-N can be stored in other locations and/or in other types of structures for later retrieval.

Figure 5:
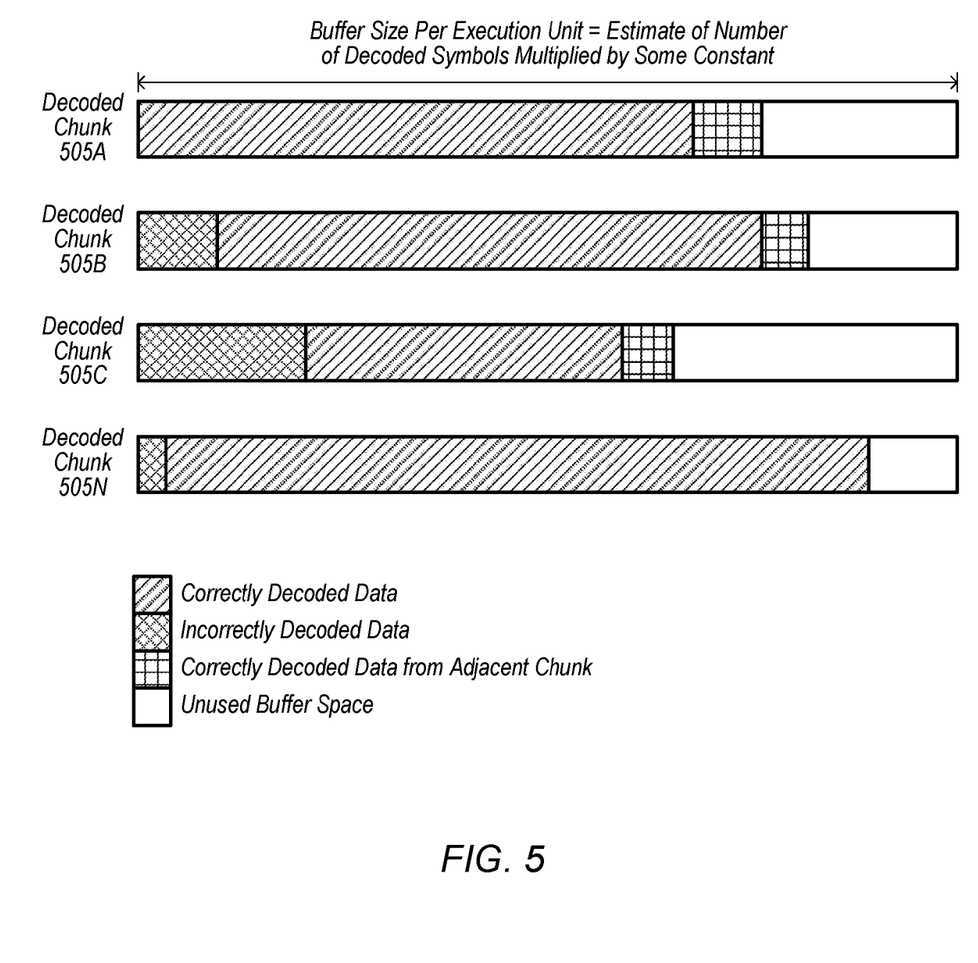
FIG. 5 is a diagram of decoded chunks of data generated by parallel execution units.

Referring now to FIG. 5, a diagram of decoded chunks of data generated by execution units operating in parallel is shown. Decoded chunk 505A represents the decoded data generated by a first execution unit, decoded chunk 505B represents the decoded data generated by a second execution unit, decoded chunk 505C represents the decoded data generated by a third execution unit, and decoded chunk 505N represents the decoded data generated by an Nth execution unit. There can be any number of other decoded chunks stored in output buffer(s), with the number varying according to the size of the original Huffman encoded data, number of execution units, and how many different chunks are decoded by each execution unit. In one embodiment, each execution unit which is decoding data stores the decoded data in a separate buffer. In another embodiment, each execution unit stores the decoded data at a specified offset in a common buffer. In one embodiment, the buffer(s)

for storing the decoded data are allocated before the Huffman decoding kernels are launched on the execution units. In one embodiment, a predetermined amount of memory space is allocated for each execution unit to store the decoded data. Accordingly, the predetermined amount of memory is chosen such that the decoded data will be able to fit in the space, resulting in a small amount of unused space in the buffer after each chunk of decoded data.

For decoded chunk 505A, since it is the first chunk of data from the Huffman encoded data, the start of the decoded chunk 505A will include correctly decoded data. This is due to the symbol boundary lining up with the chunk boundary at the start of the Huffman encoded data. Decoded chunk 505A also includes correctly decoded data from a portion of the adjacent chunk. Also, in decoded chunk 505A, there is a portion of unused buffer space after the end of the correctly decoded data from the portion of the adjacent chunk. For decoded chunks 505B-N, since the starting position of the chunk does not necessary fall on a symbol boundary, the start of the decoded chunk 505B can include a portion of incorrectly decoded data.

At some point in each chunk 505B-N, the decoded data will regain proper alignment, and the decoded data will transition to being correctly decoded data at this point. Then, at the end of the assigned chunk of data, each chunk 505B-N (except for chunk 505N) will include a portion of correctly decoded data from the adjacent chunk. Also, random amounts of unused buffer space can also be included at the end of each decoded chunk 505B-N.

Figure 6:
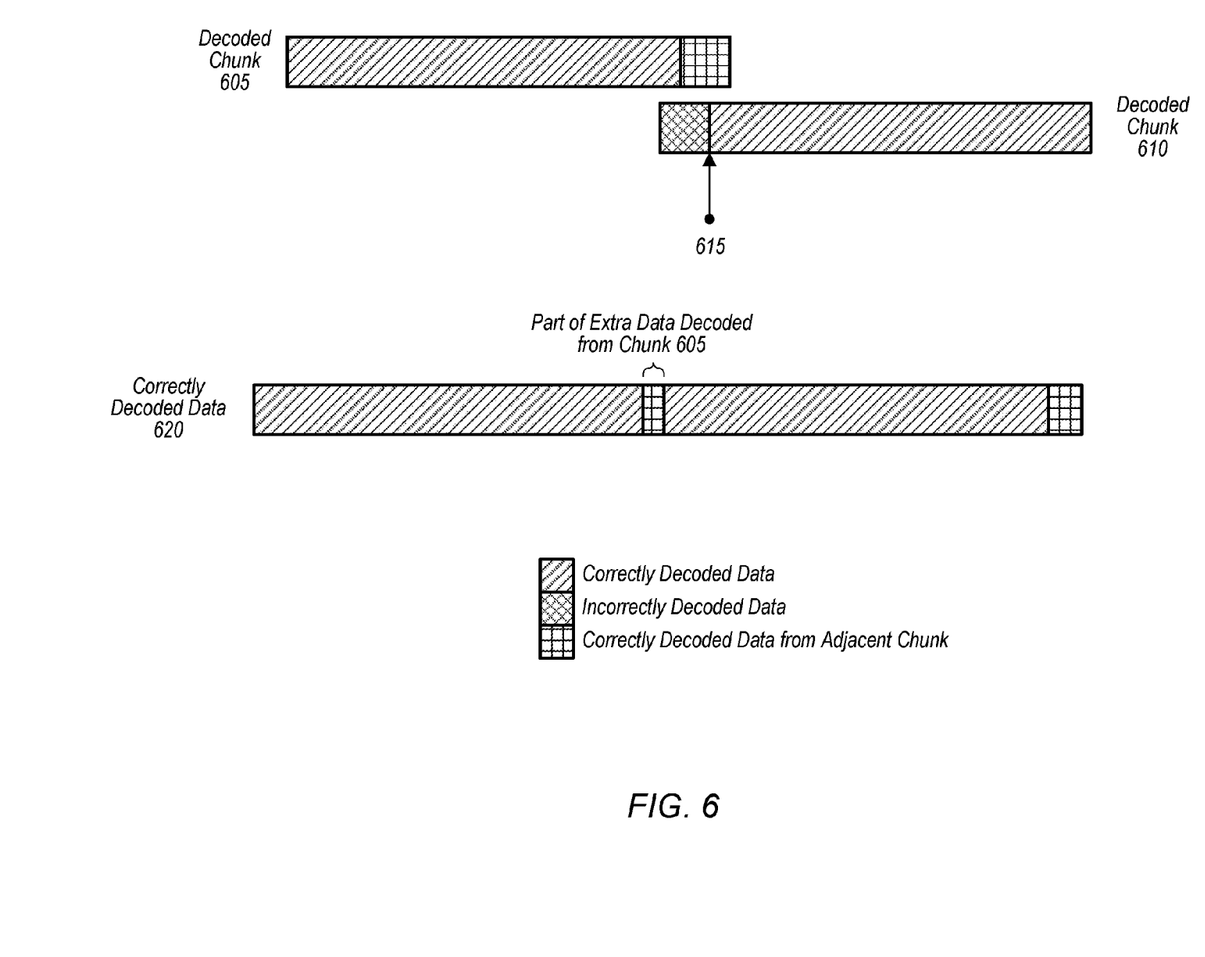
FIG. 6 is a diagram of one embodiment of determining where the end of invalid data occurs after a chunk boundary.

Turning now to FIG. 6, a diagram of one embodiment of determining where the end of invalid data occurs after a chunk boundary is shown. In one embodiment, during part one of the decoding process, each execution unit, in parallel with the other execution units, decodes a chunk of data plus an extra amount of data from an adjacent chunk. Then, during part two of the decoding process, each execution unit, in parallel with the other execution units, searches the decoded data of the subsequent chunk of data (decoded by the adjacent execution unit) for the first end of symbol location that matches an end of symbol location in the decoded extra amount of data. This search for the matching end of symbol location is illustrated in FIG. 6.

Decoded chunk of data 605 is shown above decoded chunk of data 610 in FIG. 6. Decoded chunk of data 605 and decoded chunk of data 610 are representative of the result of decoding two adjacent chunks of data from the Huffman encoded data by two different execution units. There is an overlapping portion after the boundary between chunks 605 and 610 where the same data is decoded separately by each execution unit. In one embodiment, the execution unit that decoded chunk of data 605 searches through decoded chunk of data 610 to find the first matching end of symbol location. In another embodiment, the execution unit that decoded chunk of data 610 searches through decoded chunk of data 605 to find the first matching end of symbol location. Alternatively, in a further embodiment, a different execution unit searches the end of decoded chunk of data 605 and the start of decoded chunk 610 to find the first matching end of symbol location.

Accordingly, an execution unit locates the spot 615 of the first matching end of symbol location in the overlapping section between chunks 605 and 610. Once the execution unit locates the spot 615, the execution unit can assume that everything in decoded chunk 610 after spot 615 is correctly decoded. In one embodiment, each execution unit (other than the last execution unit which decodes the final chunk of data) is configured to perform this step to locate the spot in its own extra decoded data where the decoded data starts to match the decoded symbol data in the adjacent execution unit's decoded data. It is to be understood that the term "adjacent" when used to describe an execution unit refers to the execution unit which decoded data immediately subsequent to the data decoded by the current execution unit.

In one embodiment, in part three of the Huffman decoding process, the valid data is reconstructed from among the different decoded chunks of data. Correctly decoded data 620 illustrates part three of the Huffman decoding process, and in this example, correctly decoded data 620 combines the decoded data from chunk 605 with the correctly encoded data from chunk 610. This process can also be performed for the other chunks of data by combining correctly decoded data from adjacent chunks. In one embodiment, each execution unit copies its valid decoded data plus the necessary decoded extra data (up to the spot where the adjacent execution unit starts producing valid decoded data) to the correct location in an output buffer. After each execution unit copies its valid decoded data into the output buffer, the entirety of the correct Huffman decoded data is available.

Figure 7:
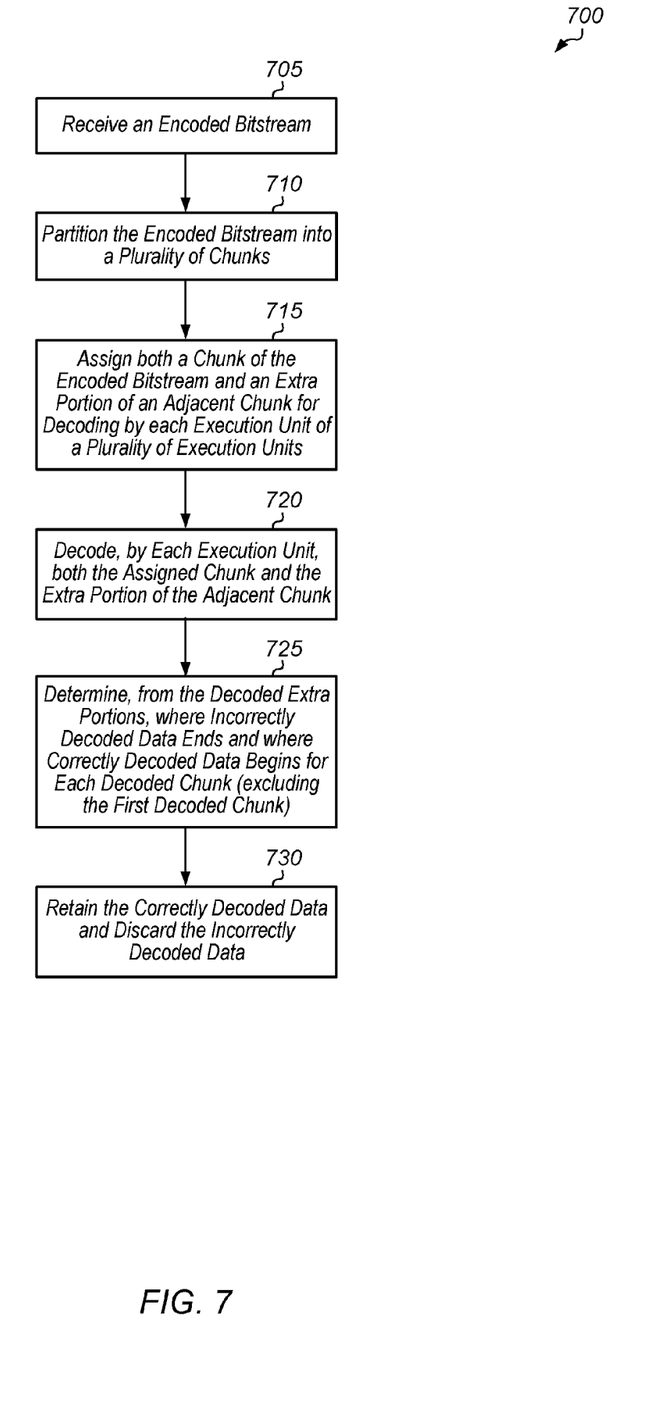
FIG. 7 is a generalized flow diagram illustrating one embodiment of a method for decoding an encoded bitstream in parallel on a plurality of execution units.

Referring now to FIG. 7, one embodiment of a method 700 for decoding an encoded bitstream in parallel on a plurality of execution units is shown. For purposes of discussion, the steps in this embodiment and those of FIG. 8-10 are shown in sequential order. However, it is noted that in various embodiments of the described methods, one or more of the elements described are performed concurrently, in a different order than shown, or are omitted entirely. Other additional elements are also performed as desired. Any of the various systems or apparatuses described herein are configured to implement method 700.

An encoded bitstream is received by a computing system with a plurality of execution units (block 705). In one embodiment, the bitstream is encoded using a variable-length code. In one embodiment, the bitstream is encoded using a Huffman code. It is assumed for the purposes of this discussion that the system already has or will receive an encoding table which specifies how to decode the bitstream. The system partitions the encoded bitstream into a plurality of chunks (block 710). In one embodiment, the encoded bitstream is partitioned into a plurality of equal-sized chunks. It is noted that the chunks are not aligned with symbol boundaries. Next, the system assigns both a chunk of the encoded bitstream and an extra portion of an adjacent chunk for decoding by each execution unit of the plurality of execution units (block 715). Then, each execution unit decodes both the assigned chunk and the extra portion of the adjacent chunk (block 720).

Next, the system determines, from the decoded extra portions, where incorrectly decoded data ends and where correctly decoded data begins for each decoded chunk (excluding the first decoded chunk) (block 725). It is noted that blocks 720 and 725 can be performed in parallel by a plurality of execution units. For example, in one embodiment, the plurality of execution units execute the same instructions simultaneously to perform blocks 720 and 725. It is also noted that block 725 does not apply to the first decoded chunk since the chunk boundary coincides with a symbol boundary at the start of the encoded bitstream. Then, the system retains the correctly decoded data and discards the incorrectly decoded data (block 730). After block 730, method 700 ends.

In one embodiment, the system utilizes a single pass to decode the bitstream. In this embodiment, the system partitions the encoded bitstream into a number of chunks such that there is a single chunk for each execution unit. For example, if the system has 64 execution units, the system partitions the encoded bitstream into 64 chunks and then assigns a different chunk (and an extra portion from the adjacent chunk) to each execution unit. In another embodiment, the system utilizes multiple passes to decode the bitstream. For example, if the system has 128 execution units, the system partitions the encoded bitstream into an integer multiple of 128, and then during each pass, the system assigns a given chunk (and an extra portion from the adjacent chunk) from a set of 128 chunks to each execution unit. After the execution units finish the first set, the system initiates the next pass to decode the next set of 128 chunks. This process can continue until all the chunks of the bitstream have been decoded.

Figure 8:
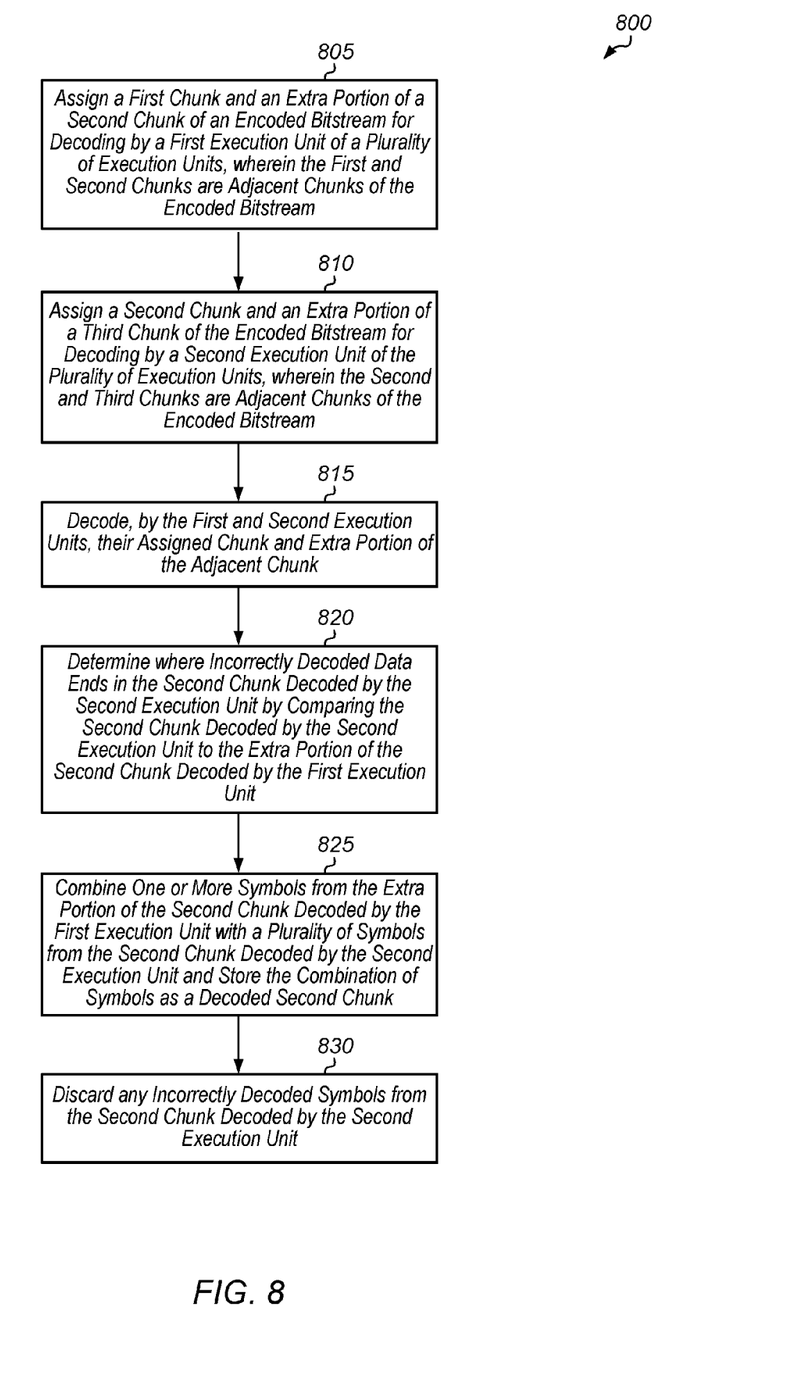
FIG. 8 is a generalized flow diagram illustrating one embodiment of a method for decoding adjacent chunks of an encoded bitstream.

Turning now to FIG. 8, one embodiment of a method 800 for decoding adjacent chunks of an encoded bitstream is shown. A first chunk and an extra portion of a second chunk of an encoded bitstream are assigned for decoding to a first execution unit of a plurality of execution units, wherein the first and second chunks are adjacent chunks of the encoded bitstream (block 805). It is noted that the extra portion of the second chunk which is assigned to the first execution unit comes from the beginning of the second chunk. In other words, the first execution unit continues decoding after it reaches the boundary between the first and second chunks for the extra portion of the second chunk. In one embodiment, the encoded bitstream is a Huffman encoded bitstream. Also, a second chunk of the encoded bitstream and an extra portion of a third chunk are assigned for decoding to a second execution unit of the plurality of execution units, wherein the second and third chunks are adjacent chunks of the encoded bitstream (block 810).

Next, the first and second executions units decode their assigned chunks and extra portions of adjacent chunks (block 815). It is noted that any number of additional execution units can also decode their assigned chunks and extra portions of adjacent chunks in parallel with the first and second execution units. Then, the system determines where incorrectly decoded data ends in the second chunk decoded by the second execution unit by comparing the second chunk decoded by the second execution unit to the extra portion of the second chunk decoded by the first execution unit (block 820). In one embodiment, block 820 is performed by the first execution unit. It is noted that other execution units can also perform a similar step in parallel with block 820 to determine where incorrectly decoded data ends in the adjacent chunk based on their decoded extra portions.

Next, the system combines one or more symbols from the extra portion of the second chunk decoded by the first execution unit with a plurality of symbols from the second chunk decoded by the second execution unit and stores the combination of symbols as a decoded second chunk (block 825). The system also discards any incorrectly decoded symbols from the second chunk decoded by the second execution unit (block 830). After block 830, method 800 ends. It is noted that method 800 can be performed by other execution units in parallel with method 800 being performed by the first and second execution units.

Figure 9:
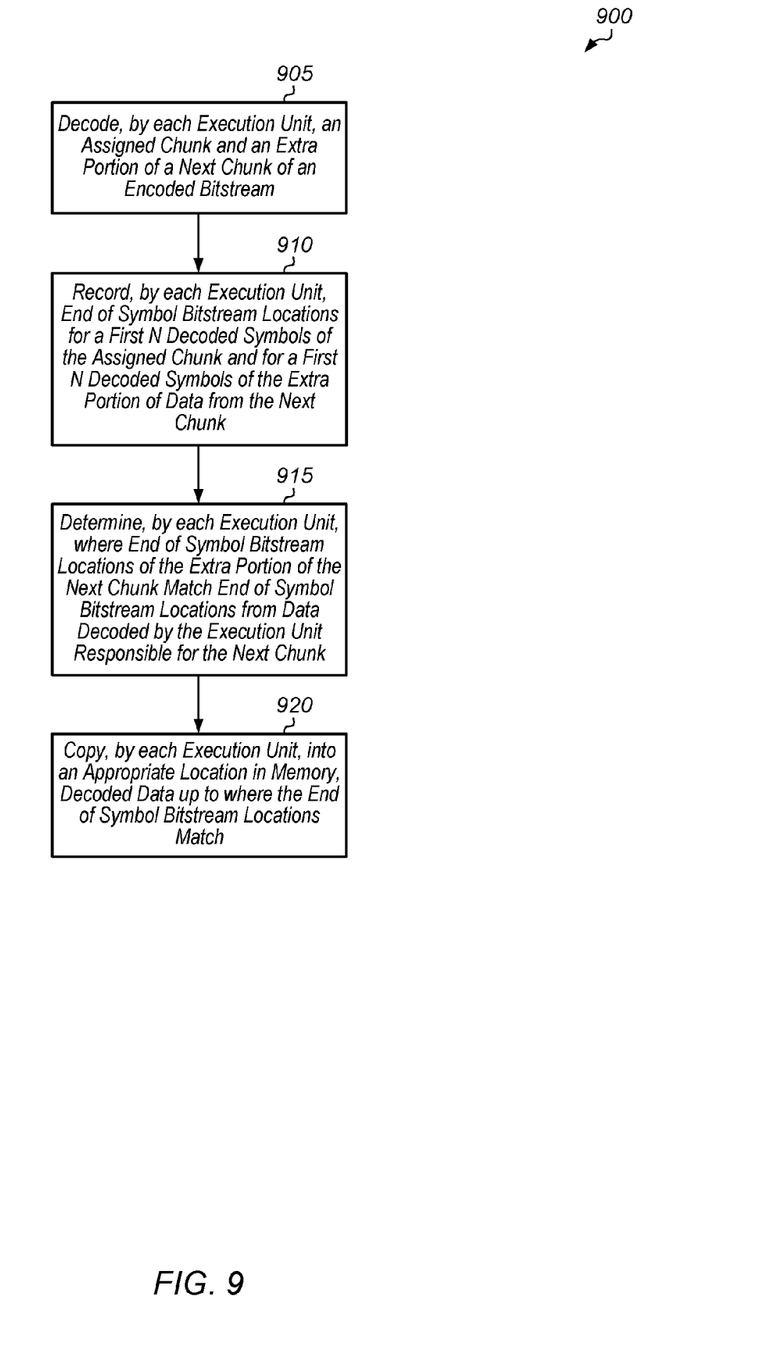
FIG. 9 is a generalized flow diagram illustrating one embodiment of a method for implementing a parallel decoding scheme.

Referring now to FIG. 9, one embodiment of a method 900 for implementing a parallel decoding scheme is shown. Each execution unit of the plurality of execution units decodes an assigned chunk and an extra portion of a next chunk of an encoded bitstream (block 905). Next, each execution unit records end of symbol bitstream locations for a first N decoded symbols of the assigned chunk and for a first N decoded symbols of the extra portion of data from the next chunk, wherein N is a positive integer (block 910).

Then, each execution unit determines where end of symbol bitstream locations of the extra portion of the next chunk match end of symbol bitstream locations from data decoded by the execution unit responsible for the next chunk (block 915). Next, each execution unit copies, into a given location in the memory, decoded data up to where the end of symbol bitstream locations match (block 920). After block 920, method 900 ends. It should be understood that the phrase "each execution unit" as used in method 900 is meant to refer to each execution unit except for the final execution unit (i.e., the execution unit decoding the final chunk of the encoded bitstream). The execution unit decoding the final chunk of the encoded bitstream will not decode extra data from the adjacent chunk since the end of the final chunk is also the end of the encoded bitstream.

In various embodiments, program instructions of a software application are used to implement the methods and/or mechanisms previously described. The program instructions describe the behavior of hardware in a high-level programming language, such as C. Alternatively, a hardware design language (HDL) is used, such as Verilog. The program instructions are stored on a non-transitory computer readable storage medium. Numerous types of storage media are available. The storage medium is accessible by a computing system during use to provide the program instructions and accompanying data to the computing system for program execution. The computing system includes at least one or more memories and one or more processors configured to execute program instructions.

It should be emphasized that the above-described embodiments are only non-limiting examples of implementations. Numerous variations and modifications will become apparent to those skilled in the art once the above disclosure is fully appreciated. It is intended that the following claims be interpreted to embrace all such variations and modifications.

What is claimed is:

1. A system comprising:
a plurality of execution units; and
a memory;
wherein the system is configured to:
  partition an encoded bitstream into a plurality of chunks;
  assign a separate chunk of the encoded bitstream and an extra portion of an adjacent chunk to each execution unit of the plurality of execution units;
  decode, by each execution unit, the chunk and the extra portion of the adjacent chunk assigned to the execution unit, wherein decoding is performed in parallel by the plurality of execution units;
  determine, from each decoded extra portion, where incorrectly decoded data ends and where correctly decoded data begins in a corresponding chunk; and
  retain correctly decoded data in the memory and discard incorrectly decoded data.

2. The system as recited in claim 1, wherein the system is configured to:
  assign a first chunk and an extra portion of a second chunk of the encoded bitstream for decoding by a first execution unit of the plurality of execution units, wherein the first and second chunks are adjacent chunks of the encoded bitstream;
  assign a second chunk and an extra portion of a third chunk for decoding by a second execution unit of the plurality of execution units, wherein the second and third chunks are adjacent chunks of the encoded bitstream;

determine where incorrectly decoded data ends in a decoded second chunk by comparing the decoded second chunk to a decoded extra portion of the second chunk; and combine one or more symbols from the decoded extra portion of the second chunk with a plurality of symbols from the decoded second chunk.

3. The system as recited in claim 1, wherein each execution unit of the plurality of execution units, excluding a last execution unit, is configured to:

decode both an assigned chunk of the encoded bitstream and the extra portion of the adjacent chunk;

record end of symbol bitstream locations for a first N decoded symbols of the assigned chunk and for a first N decoded symbols of the extra portion of data from the next chunk, wherein N is a positive integer;

determine where end of symbol bitstream locations of the extra portion of the adjacent chunk match end of symbol bitstream locations from data decoded by an adjacent execution unit for the adjacent chunk; and copy, into a location in the memory, decoded data up to where the end of symbol bitstream locations match.

4. The system as recited in claim 1, wherein the system is further configured to determine a size of an extra portion of an adjacent chunk to decode by each execution unit.

5. The system as recited in claim 4, wherein said determining is performed by analyzing a table specifying how the bitstream was encoded.

6. The system as recited in claim 1, wherein the encoded bitstream is encoded using a variable length code.

7. The system as recited in claim 6, wherein the variable length code is a Huffman code.

8. A method comprising:

partitioning an encoded bitstream into a plurality of chunks;

assigning a separate chunk of the encoded bitstream and an extra portion of an adjacent chunk to each execution unit of a plurality of execution units;

decoding, by each execution unit, the chunk and the extra portion of the adjacent chunk assigned to the execution unit, wherein decoding is performed in parallel by the plurality of execution units;

determining, from each decoded extra portion, where incorrectly decoded data ends and where correctly decoded data begins in a corresponding chunk; and retaining correctly decoded data in a memory and discard incorrectly decoded data.

9. The method as recited in claim 8, further comprising:

assigning a first chunk and an extra portion of a second chunk of the encoded bitstream for decoding by a first execution unit of the plurality of execution units, wherein the first and second chunks are adjacent chunks of the encoded bitstream;

assigning a second chunk and an extra portion of a third chunk for decoding by a second execution unit of the plurality of execution units, wherein the second and third chunks are adjacent chunks of the encoded bitstream;

determining where incorrectly decoded data ends in a decoded second chunk by comparing the decoded second chunk to a decoded extra portion of the second chunk; and combining one or more symbols from the decoded extra portion of the second chunk with a plurality of symbols from the decoded second chunk.

10. The method as recited in claim 9, further comprising:

decoding both an assigned chunk of the encoded bitstream and the extra portion of the adjacent chunk;

recording end of symbol bitstream locations for a first N decoded symbols of the assigned chunk and for a first N decoded symbols of the extra portion of data from the next chunk, wherein N is a positive integer;

determining where end of symbol bitstream locations of the extra portion of the adjacent chunk match end of symbol bitstream locations from data decoded by an adjacent execution unit for the adjacent chunk; and copying, into a location in the memory, decoded data up to where the end of symbol bitstream locations match.

11. The method as recited in claim 8, further comprising determining a size of an extra portion of an adjacent chunk to decode by each execution unit.

12. The method as recited in claim 11, wherein said determining is performed by analyzing a table specifying how the bitstream was encoded.

13. The method as recited in claim 8, wherein the encoded bitstream is encoded using a variable length code.

14. The method as recited in claim 13, wherein the variable length code is a Huffman code.

15. An apparatus comprising:

a command processor; and a plurality of execution units;

wherein the apparatus is configured to:

partition an encoded bitstream into a plurality of chunks;

assign a separate chunk of the encoded bitstream and an extra portion of an adjacent chunk to each execution unit of the plurality of execution units;

decode, by each execution unit, the chunk and the extra portion of the adjacent chunk assigned to the execution unit, wherein decoding is performed in parallel by the plurality of execution units;

determine, from each decoded extra portion, where incorrectly decoded data ends and where correctly decoded data begins in a corresponding chunk; and retain correctly decoded data in a memory and discard incorrectly decoded data.

16. The apparatus as recited in claim 15, wherein the apparatus is further configured to:

assign a first chunk and an extra portion of a second chunk of the encoded bitstream for decoding by a first execution unit of the plurality of execution units, wherein the first and second chunks are adjacent chunks of the encoded bitstream;

assign a second chunk and an extra portion of a third chunk for decoding by a second execution unit of the plurality of execution units, wherein the second and third chunks are adjacent chunks of the encoded bitstream;

determine where incorrectly decoded data ends in a decoded second chunk by comparing the decoded second chunk to a decoded extra portion of the second chunk; and combine one or more symbols from the decoded extra portion of the second chunk with a plurality of symbols from the decoded second chunk.

17. The apparatus as recited in claim 15, wherein each execution unit of the plurality of execution units, excluding a last execution unit, is configured to:

decode both an assigned chunk of the encoded bitstream and the extra portion of the adjacent chunk;

record end of symbol bitstream locations for a first N decoded symbols of the assigned chunk and for a first N decoded symbols of the extra portion of data from the next chunk, wherein N is a positive integer;

determine where end of symbol bitstream locations of the extra portion of the adjacent chunk match end of symbol bitstream locations from data decoded by an adjacent execution unit for the adjacent chunk; and copy, into a location in the memory, decoded data up to where the end of symbol bitstream locations match.

18. The apparatus as recited in claim 15, wherein the apparatus is configured to determine a size of an extra portion of an adjacent chunk to decode by each execution unit.

19. The apparatus as recited in claim 18, wherein said determining is performed by analyzing a table specifying how the bitstream was encoded.

20. The apparatus as recited in claim 15, wherein the encoded bitstream is encoded using a variable length code.

* * * * *